(12) United States Patent
Chen et al.

(10) Patent No.: US 7,075,790 B2
(45) Date of Patent: Jul. 11, 2006

(54) HEAT DISSIPATING DEVICE INCORPORATING CLIP

(75) Inventors: Chun-Chi Chen, Tu-Chen (TW); Xue-Wen Peng, Shenzhen (CN); Hsieh Kun Lee, Tu-Chen (TW); Cheng-Tien Lai, Tu-Chen (TW); Zhi-Yong Zhou, Shenzhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 149 days.

(21) Appl. No.: 10/900,553

(22) Filed: Jul. 27, 2004

(65) Prior Publication Data

US 2005/0045311 A1    Mar. 3, 2005

(30) Foreign Application Priority Data

Jul. 30, 2003   (TW) .............................. 92213897 U

(51) Int. Cl.
*H05K 7/20* (2006.01)

(52) U.S. Cl. ..................... 361/704; 165/80.3; 165/185; 257/718; 257/727; 174/16.3

(58) Field of Classification Search ..................... None
See application file for complete search history.

(56) References Cited

U.S. PATENT DOCUMENTS

| 6,061,239 A | 5/2000 | Blomquist |
| 6,082,440 A | 7/2000 | Clements et al. |
| 6,181,559 B1 | 1/2001 | Seo |
| 6,318,452 B1 * | 11/2001 | Lee ............................ 165/80.3 |
| 6,421,242 B1 * | 7/2002 | Chen ........................... 361/704 |
| 6,450,248 B1 * | 9/2002 | Chang ........................ 165/80.3 |
| 6,542,367 B1 * | 4/2003 | Shia et al. ................... 361/703 |
| 6,643,133 B1 * | 11/2003 | Liu ............................ 361/704 |
| 6,731,504 B1 * | 5/2004 | Liu ............................. 361/704 |
| 6,978,827 B1 * | 12/2005 | Armstrong ................. 165/80.3 |
| 6,988,871 B1 * | 1/2006 | Deboer et al. ............. 415/176 |

* cited by examiner

*Primary Examiner*—Boris Chervinsky
(74) *Attorney, Agent, or Firm*—Wei Te Chung

(57) ABSTRACT

A heat dissipating device includes a heat sink (50) and two clips (10) for mounting the heat sink to a retention module (60) which surrounds an electronic component (65). The heat sink provides two shoulders (72). Each clip includes a strap (21) supported on one shoulder, a lever (40) having a cam pivotally connected to the strap, two legs (30) pivotally connected to opposite end portions of the strap, and two spring fingers (26) integrally extending from opposite ends of the strap. In assembly, the straps are downwardly pressed and the retention module push the legs to pivot away from the feet from original states toward forced states. When the legs arrive openings of the retention module the fingers urge the legs to enter the openings. The levers are then pivoted to push the straps to move upwardly to thereby cause the legs to firmly engage in the openings.

15 Claims, 4 Drawing Sheets

HEAT DISSIPATING DEVICE INCORPORATING CLIP

BACKGROUND OF THE INVENTION

1. Field of the Invention

The present invention relates to a heat dissipating device, and particularly to a heat dissipating device incorporating a clip which can readily and conveniently mount a heat sink to an electronic component.

2. Related Art

As computer technology continues to advance, electronic components such as central processing units (CPUs) of computers are being made to provide faster operational speeds and greater functional capabilities. When a CPU operates at high speed in a computer enclosure, its temperature can increase greatly. It is desirable to dissipate the generated heat quickly, for example by using a heat sink attached to the CPU in the enclosure. This allows the CPU and other electronic components in the enclosure to function within their normal operating temperature ranges, thereby assuring the quality of data management, storage and transfer. Oftentimes, a clip is required for mounting the heat sink to the CPU.

A wide variety of heat dissipating devices and clips are available in the prior art. In earlier time, a linear type of wire clip was widely used. However, in many modern applications such as when a large heat sink is used, the linear clip cannot firmly retain the heat sink against the CPU. Subsequently, wider plate-type of clips and cam-type clips were developed. For example, U.S. Pat. No. 6,061,239 discloses a cam-type clip for mounting a heat sink to an electronic component. The clip comprises an elongated resilient strap and a cam-type latch pivotally connected to a middle of the elongated strap. The elongated strap has a relatively flat center portion and is bent at each end to form two legs. The lower ends of the legs are each provided with holding means for engaging a semiconductor module so as to secure the clip and the heat sink to the module. In assembly, the two legs are required to moved outward by a user to thereby allow the two legs to enter into holes defined in the module. It is complicated and time-consuming to move the legs in assembly.

SUMMARY OF THE INVENTION

Accordingly, an object of the present invention is to provide a heat dissipating device incorporating a clip which can readily and conveniently mount a heat sink to an electronic component.

Another object of the present invention is to provide a heat dissipating device comprising a heat sink and a clip which can be pre-assembled together.

To achieve the above-mentioned objects, a heat dissipating device in accordance with a first preferred embodiment of the present invention comprises a heat sink and a pair of clips for mounting the heat sink to a retention module which surrounds an electronic component. The heat sink comprises a pair of shoulders on opposite sides thereof. Each clip comprises a strap supported on the shoulder, a lever having a cam pivotally connected to the strap, a pair of legs pivotally connected to opposite end portions of the strap, and a pair of spring fingers integrally extending from opposite ends of the strap. In assembly, the strap is downwardly pressed and feet of the retention module push the legs to pivot away from the feet from original states toward forced states. When the legs arrive openings of the feet the spring fingers of the clips urge the legs to return to original states from the forced states and enter the openings of the retention module. The levers are then pivoted from the vertical positions to the horizontal positions. The farthest points of the cams relative to pivot axes of the levers abut against the shoulders of the locking plates. The straps are therefore moved in a direction away from the shoulders to thereby cause the legs to firmly engage in the openings of the retention module. Simultaneously, the shoulders are pressed downwardly to thereby cause the heat sink to firmly contact the electronic component.

In a second preferred embodiment of the present invention, the strap of the clip further comprises a pair of posts, and the shoulder defines a pair of cutouts. Each post comprises a head and a neck, and each cutout comprises an entrance for extension of the head therethrough and a locking notch for locking the neck therein. The clip can be pre-assembled to the heat sink by way of the posts are locked in the locking notches. The pair of clips of the heat dissipating device are connected together by a bar connecting the levers of the clips.

Other objects, advantages and novel features of the present invention will be drawn from the following detailed description of a preferred embodiment of the present invention with attached drawings, in which:

DATAILED DESCRIPTION OF THE INVENTION

Figure 1:
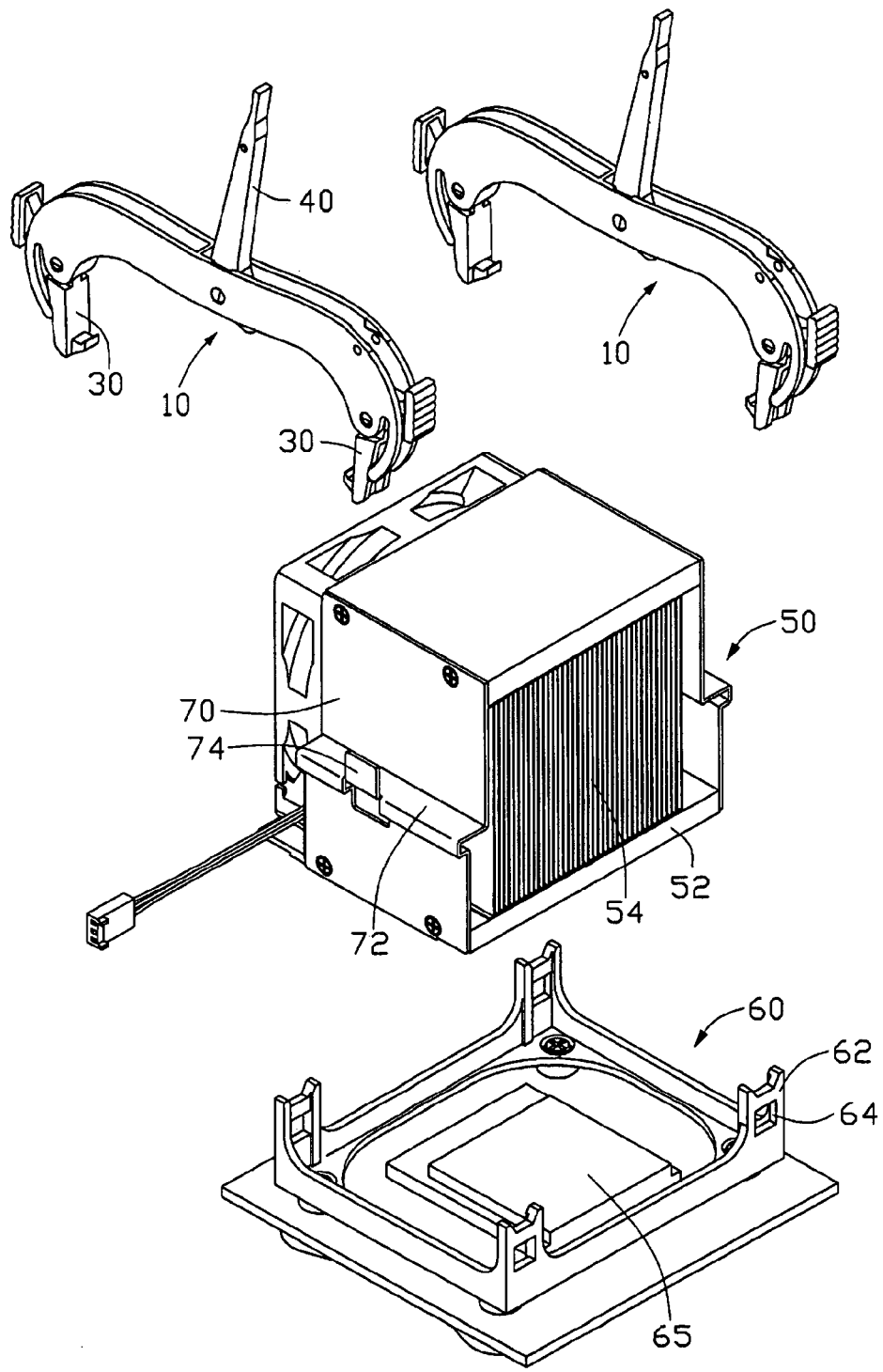
FIG. 1 is an exploded, isometric view of a heat dissipating device in accordance with a first preferred embodiment of the present invention, an electronic component and a retention module.

FIG. 1 shows a heat dissipating device in accordance with a preferred embodiment of the present invention, and an electronic component 65 surrounded by a retention module 60. The electronic component 65 is mounted on a circuit board (not labeled) on which the retention module 60 is installed. The retention module 60 comprises four locking feet 62 formed at four corners thereof. Each locking foot 62 defines a locking opening 64 therein.

The heat dissipating device comprises a heat sink 50 and a pair of clips 10. The heat sink 50 comprises a base 52 for contacting the electronic component 65, and a plurality of parallel fins 54 extending upwardly from the base 52. A pair of locking plates 70 is attached on opposite sides of the fins 54, parallel to the fins 54. Each locking plate 70 has a shoulder 72 formed adjacent a middle portion thereof. A stopping tab 74 is stamped upwardly from the shoulder 72. The stopping tab 74 is parallel to the fins 54.

Figure 2:
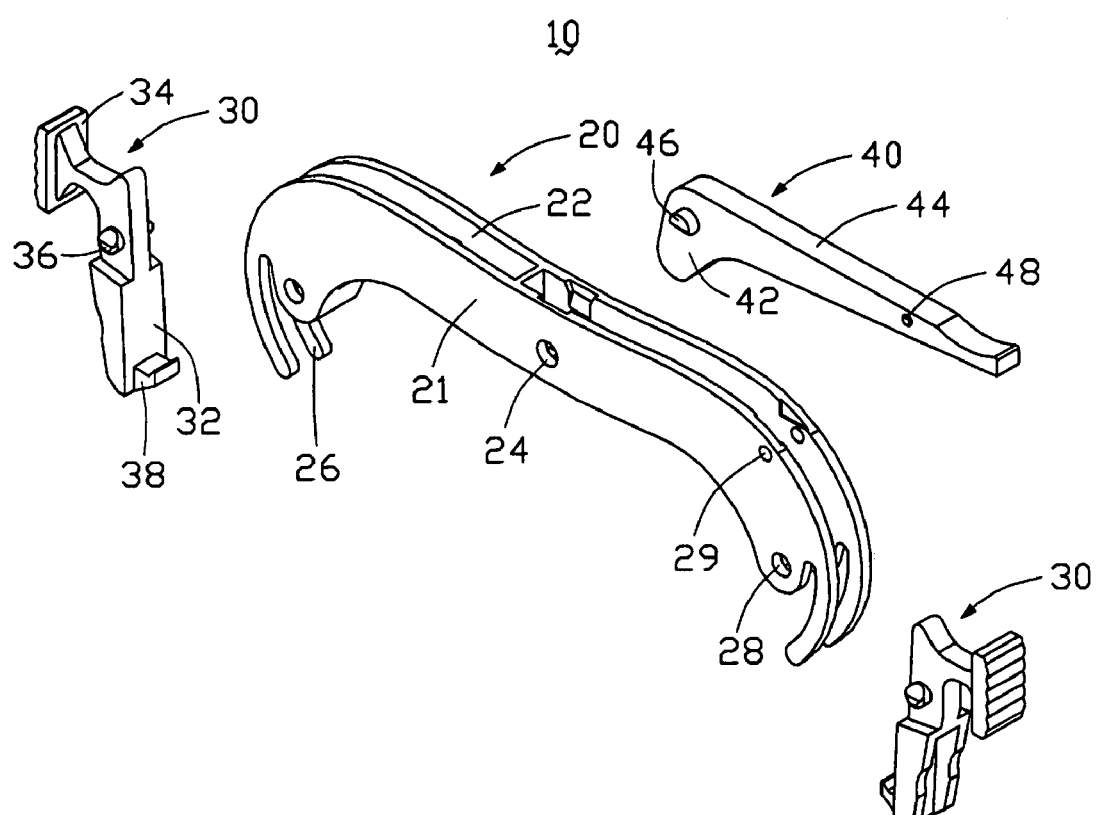
FIG. 2 is an exploded view of a clip of the heat dissipating device of FIG. 1.

Referring also to FIG. 2, one clip 10 will be described in detail since both are identical in construction, function and operation. The clip 10 comprises an elongate strap 20, a pair of legs 30, and a lever 40. The strap 20 defines a through groove 22 spanning from one end thereof to an opposite end thereof. The strap 20 is therefore divided into two parts 21 connected by connecting bars (not labeled). A pair of coaxial through apertures 24 is defined in middle portions of the parts 21. The through apertures 24 are in communication with the groove 22. A pair of arcuate spring fingers 26 extends downwardly from opposite ends of each part 21. A pair of coaxial through holes 28 is defined in each of opposite end portions of the parts 21, in communication with the groove 22. A pair of bores 29 is defined in insides of the parts 21 respectively, adjacent to one end of the strap 20.

Each leg 30 comprises a main body 32 and an handle 34 connected with a top end of the main body 32. A hook 38 is formed on a bottom portion of the main body 32 corresponding to a respective opening 64 of the retention module 60. The hook 38 has a slant bottom surface. A pair of pivots 36 is formed on opposite sides of an upper portion of the main body 32. The pivots 36 are received in the corresponding through holes 28 of the strap 20 thereby pivotably attaching the leg 30 to the strap 20. The spring fingers 26 are located between the corresponding main body 32 and handle 34 with free ends of the spring fingers 26 abutting against an outside of the main body 32 (See FIG. 1). When the handle 34 is pressed toward a center of the strap 20 the main body 32 is pivoted outwardly about the pivots 36 from an original state to an forced state. When the handle 34 is released the main body 32 returns to its original state under the action of the elastic force of the spring fingers 26.

The lever 40 comprises a cam 42 formed on one end thereof, and an extension portion 44 extending from the cam 42. A pair of projections 46 is formed on opposite sides of the cam 42. A pair of protrusions 48 is formed on opposite sides of an end portion of the extension portion 44. The cam 42 is extended through the groove 22. The projections 46 are received in the corresponding through apertures 24 of the strap 20, thereby pivotably attaching the lever 40 to the strap 20.

Figure 3:
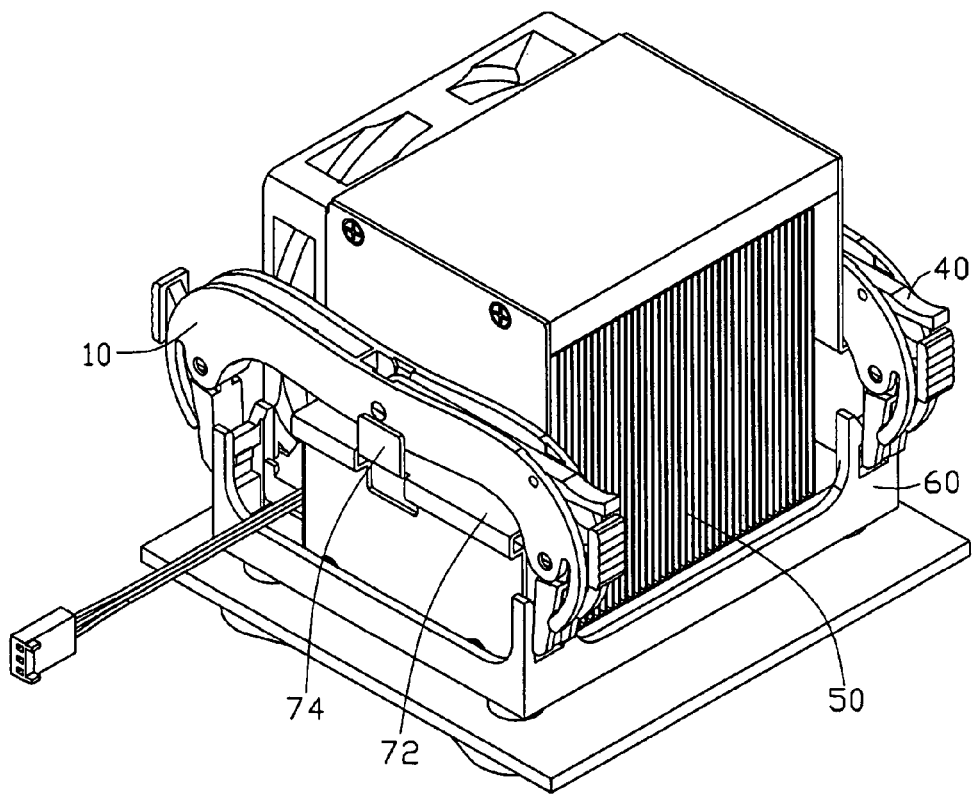
FIG. 3 is an assembled view of FIG. 1.

Referring to FIG. 3, in assembly, the heat sink 50 is mounted on the electronic component 65 within the retention module 60. The clips 10 are then placed on the corresponding shoulders 72 of the locking plates 70 between the stopping tabs 74 and the locking plates 70. The lever 40 are located at the vertical positions. The straps 20 of the clips 10 are downwardly pressed. The hooks 38 which have the slant bottom surfaces are pressed by the feet 62 of the retention module 60 in directions of away from the feet 62. The legs 30 are therefore pivoted outwardly about the pivots 36 until the hooks 38 arrive the openings 64 of the retention module 60. The hooks 38 are extended through the openings 64 under the action of the elastic force of the spring fingers 26. The levers 40 are then pivoted to the horizontal positions. At this state, the farthest points of the cams 42 relative to the projections 46 abut against the shoulders 72 of the locking plates 70, respectively. The straps 20 are therefore moved upwardly to thereby cause the legs 30 to firmly engage in the openings 64 of the retention module 60. Simultaneously, the shoulders 72 are pressed downwardly to thereby cause the heat sink 50 to firmly contact the electronic component 65. The protrusions 48 of the levers 40 are received in the bores 29 of the straps 20 for preventing the levers 40 from moving to the vertical positions undesignedly.

In disassembly, the lever 40 is pivoted from the horizontal position to the vertical position. The handles 34 of the legs 30 are then pressed toward the feet 62. The main bodies 32 of the legs 30 are therefore pivoted away from the feet 62 to release the hooks 38 from the openings 64 of the feet 62. The clip 10 is then readily taken away from the retention module 60.

Figure 4:
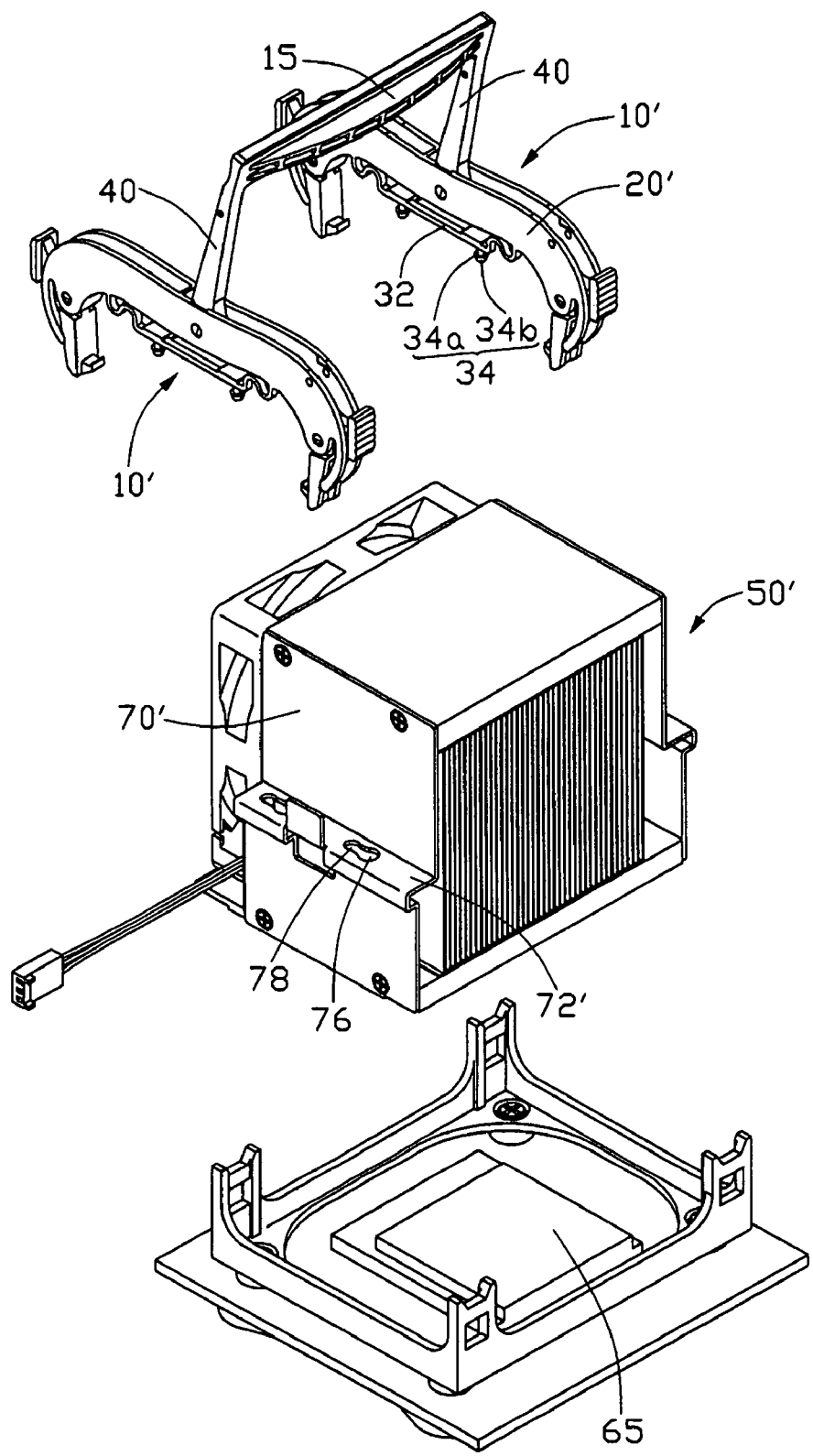
FIG. 4 is an exploded, isometric view of a heat dissipating device in accordance with a second preferred embodiment of the present invention, an electronic component and a retention module.

FIG. 4 shows a heat dissipating device in accordance with a second preferred embodiment of the present invention. The heat dissipating device comprises a heat sink 50' and a pair of clips 10'. The heat sink 50' is similar to the heat sink 50 of the first preferred embodiment except the locking plates 70'. The shoulders 72 of the locking plates 70 each defines a pair of cutouts. Each cutout comprises an entrance 76 and a locking notch 78 in communication with the entrance 76. The pair of clips 10' are connected with each other by a bar 15 connecting with the levers 40. The clip 10' is similar to the clip 10 of the first preferred embodiment except that the strap 20' of the clip 10' has a pressing tab 82 formed on a bottom surface thereof. A pair of posts 84 is formed on a bottom surface of the pressing tab 82. Each post 84 comprises a head 84a formed at bottom end thereof, and a neck 84b formed between the head 84a and the pressing tab 82. When the straps 20' of the clips 10' are placed on the shoulders 72' of the locking plates 70' the posts 84 extend through the entrances 76 of the shoulders 72' with the necks 84b received in the entrances 76. The clips 10' are then moved to cause the necks 84b to enter the locking notches 78. The heads 84b of the posts 84 engage with bottom surfaces of the shoulders 72' below the locking notches 78. The clips 10' are thus pre-assembled to the heat sink 50', which facilitates transportation and simplifying the next process of mounting the heat sink 50' to the electronic component 65.

As an alternative of the first preferred embodiment of the present invention, the levers 40 of the clips 10 can be connected with each other by a bar. As an alternative of the second preferred embodiment of the present invention, the two clips 10' can also be separate.

In the present invention, the hooks 38 of the clips 10, 10' each have a slant bottom surface. When the straps 20, 20' of the clips 10, 10' are downwardly pressed the legs 30 are pivoted outwardly from the original states to the forced states. When the hooks 38 arrive the openings 64 of the retention module 60 the hooks 38 will enter the openings 64 under the action of the spring fingers 26. In the mounting process, the legs 30 of the clips 10, 10' do not require additional action of a user.

It is understood that the invention may be embodied in other forms without departing from the spirit thereof. Thus, the present example and embodiment is to be considered in all respects as illustrative and not restrictive, and the invention is not to be limited to the details given herein.

What is claimed is:

1. A clip for mounting a heat sink to a heat generating component surrounded by
    a retention module, the clip comprising:
    a strap adapted for being supported on the heat sink;
    a leg pivotally connected to an end portion of the strap, the leg being pivotable from an original state to a forced state by an external force; and
    means for returning the leg from the forced state to the original state after the external force is withdrawn; wherein said means comprises an arcuate spring finger integrally extending from the end portion of the strap.

2. The clip as claimed in claim 1, wherein the leg comprises a main body and a handle extending from a top portion of the main body, and when the handle is pressed toward the strap the main body is pivoted from the original state to the forced state.

3. The clip as claimed in claim 2, wherein the main body comprises a hook formed on a bottom end thereof, for engaging with the retention module thereby mounting the heat sink to the heat generating component.

4. The clip as claimed in claim 2, wherein the strap comprises a groove along a longitudinal direction thereof and a pair of parts on opposite sides of the groove, and the top portions of the main bodies are received in the groove.

5. The clip as claimed in claim 4, wherein the leg comprises a pair of pivots formed on opposite sides of the top portion thereof, and the parts defines a pair coaxial holes receiving the pivots therein, respectively.

6. The clip as claimed in claim 1, further comprising a lever pivotally connected to the strap, the lever being pivotable between a vertical position and a horizontal position.

7. A heat dissipating device assembly comprising:
an electronic component;
a retention module surrounding the electronic component, the retention module comprising a pair of feet each comprising a locking means;
a heat sink located on the electronic component, the heat sink comprising a base contacting the electronic component, and a plurality of fins arranged on the base;
a shoulder provided on the heat sink between the feet; and
one clip comprising a strap supported on the shoulder, a pair of legs pivotally connected to opposite end portions of the strap, and a returning means,
wherein when the strap is downward pressed the feet push the legs to pivot in directions away from the feet from original states toward forced states and when the legs arrive the locking means the returning means urges the legs to return to the original states from the forced states to allow the legs to engage with the locking means, wherein the returning means comprises a pair of spring fingers integrally extending from opposite ends of the strap, respectively.

8. The heat dissipating device assembly as claimed in claim 7, wherein the clip further comprises a lever having a cam pivotally connected to the strap, and when the lever is moved from a released position to a locked position the strap is moved upwardly by the cam to thereby cause the legs to firmly engage with the locking means.

9. The heat dissipating device assembly as claimed in claim 8, wherein each of the legs comprises a main body and a handle extending from a top portion of the main body, and wherein when the handle is pressed toward the foot the main body is moved from the original state to the forced state and when the handle is released the main body is moved from the forced state to the original state by a corresponding spring finger.

10. The heat dissipating device assembly as claimed in claim 9, wherein the main body comprises a hook formed at a bottom end portion thereof, the locking means comprises a pair of openings defined in the feet, the hook engaging with a corresponding opening when the lever is located at the locked position.

11. The heat dissipating device assembly as claimed in claim 10, wherein the hook forms a slant bottom face for facilitating the leg to slid along the foot when the strap is downwardly pressed.

12. The heat dissipating device assembly as claimed in claim 9, wherein the strap further comprises a post, and the shoulder defines a cutout locking the post therein to thereby combine the clip to the heat sink.

13. The heat dissipating device assembly as claimed in claim 12, wherein the post comprises a head and a neck, and the cutout comprises an entrance for extension of the head therethrough and a locking notch for locking the neck therein.

14. The heat dissipating device assembly as claimed in claim 8, wherein the lever comprises a protrusion, and the strap defines a bore, the protrusion being engaged in the bore when the lever is located at the locked position, for preventing the lever from moving to the released position undesignedly.

15. The heat dissipating device assembly as claimed in claim 8, comprising a pair of said clips connected together by a bar connecting the levers of the clips.

* * * * *